(12) United States Patent
Furukawa

(10) Patent No.: US 6,914,367 B2
(45) Date of Patent: Jul. 5, 2005

(54) SURFACE ACOUSTIC WAVE DEVICE AND METHOD OF MANUFACTURING THE DEVICE

(75) Inventor: Osamu Furukawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/312,863

(22) PCT Filed: Jul. 6, 2001

(86) PCT No.: PCT/JP01/05885

§ 371 (c)(1),
(2), (4) Date: Jan. 2, 2003

(87) PCT Pub. No.: WO02/05424

PCT Pub. Date: Jan. 17, 2002

(65) Prior Publication Data

US 2003/0112986 A1 Jun. 19, 2003

(30) Foreign Application Priority Data

Jul. 6, 2000 (JP) .......................... 2000-205159

(51) Int. Cl.$^7$ ........................ H01L 41/053; H03H 9/10; H03H 9/25
(52) U.S. Cl. ................... 310/340; 310/313 R; 310/348
(58) Field of Search ............................. 310/313 R, 340, 310/348

(56) References Cited

U.S. PATENT DOCUMENTS 5,900,581 A * 5/1999 Ootake ..................... 174/52.2
6,262,513 B1   7/2001 Furukawa et al. ...... 310/313 R
6,329,739 B1 * 12/2001 Sawano ................... 310/313 R
6,446,316 B1 * 9/2002 Furbacher et al. ......... 29/25.35
6,628,043 B2 * 9/2003 Furukawa et al. ...... 310/313 R
6,663,943 B2 * 12/2003 Kadota ....................... 428/156

FOREIGN PATENT DOCUMENTS

| EP | 0 840 369 | 5/1998 | |
| JP | 7-111438 | 4/1995 | ............ H03H/9/25 |

* cited by examiner

Primary Examiner—Thomas M. Dougherty
(74) Attorney, Agent, or Firm—Oblon, Spivak, McClelland, Maier & Neustadt, P.C.

(57) ABSTRACT

A surface acoustic wave device used in, for example, a mobile communications field as a filter or duplexer and the like to handle high frequencies of about several GHz is fabricated by flip-chip-connecting a surface of a piezoelectric substrate to a base board facing thereto, emitting particulate first sealing material from above a back face of the piezoelectric substrate to apply the first sealing material to the back face of the piezoelectric substrate and hang the first sealing material from edges of the piezoelectric substrate to the base board to form bridging, and forming second sealing material on the first sealing material. These operations provide a manufacturing method of a small-sized surface-mounting surface acoustic wave device appropriate for flip-chip connection.

6 Claims, 7 Drawing Sheets

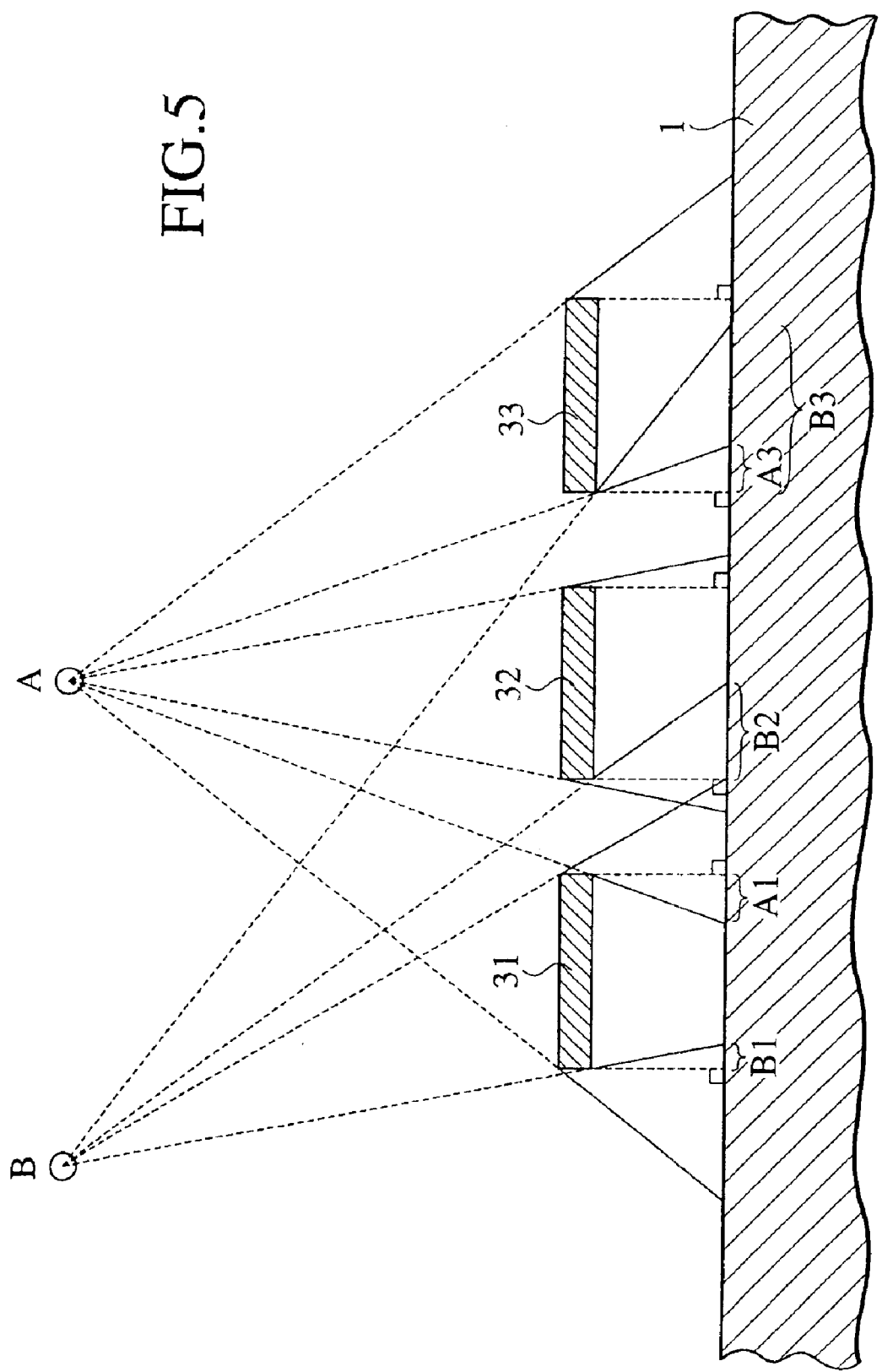

SURFACE ACOUSTIC WAVE DEVICE AND METHOD OF MANUFACTURING THE DEVICE

TECHNICAL FIELD

The present invention relates to the mounting of a surface acoustic wave element, and particularly, to a sealing technique for a surface acoustic wave device used for a mobile communication apparatus such as a cellular phone.

BACKGROUND ART

In recent years, to realize miniaturization and surface-mounting, a surface acoustic wave device is made by flip-chip-connecting a transducer face of a surface acoustic wave element to a base board (circuit board) having wiring patterns and facing the transducer face. To make mass production easy, the base board is made from a multi-piece board (base-board aggregate) which is divided into individual pieces after predetermined processes.

Sealing methods for surface acoustic wave elements include a method of covering an element with a cap-like sealing material and bonding the sealing material to a base board and a method of bonding surface acoustic wave elements in a wafer state not individually divided to a multi-piece board and collectively dicing the surface acoustic wave elements in the wafer state, the base-board aggregate, and an adhesive bonding them together, into individual pieces.

However, the former method requires the cap-like sealing material to be prepared separately and newly needs the bonding process on the base board. Further, a new process is needed to hardening the adhesive to bond the cap-like sealing material and base board together. In this way, the former method increases extra processes and reduces productivity.

On the other hand, the latter method needs a process of simultaneously dicing the surface acoustic wave elements and base boards that involve different kinds of material. In this process, the surface acoustic wave elements may have problems of breakage, chipping off, or separation between parts, to provide insufficient sealing property and deteriorate yield.

DISCLOSURE OF INVENTION

The present invention has been made in the above-mentioned situation and intends to provide a compact, surface-mounting surface acoustic wave device capable of easily realizing sealing ability and appropriate for flip-chip connection, as well as a manufacturing method thereof.

In order to accomplish the object, a first aspect of the present invention provides a surface acoustic wave device having a surface acoustic wave element with an interdigital transducer formed on a surface of a piezoelectric substrate, a base board to which the surface acoustic wave element is flip-chip-connected with a given space formed between them, a base layer (first sealing material) applied to a back face of the piezoelectric substrate and hanging from edges of the piezoelectric substrate to the base board to form bridging, and a clad layer (second sealing material) applied to the base layer.

According to the first aspect of the present invention, the surface acoustic wave element is sealed with the shape of the space formed by the flip-chip connection between the piezoelectric substrate and the base board kept as it is. Namely, no sealing material enters the space between the piezoelectric substrate and the base board, and the surface acoustic wave element is airtightly sealed with the space kept under the interdigital transducer. When forming the base layer and clad layer, there will be no misalignment of the base layer and clad layer relative to the piezoelectric substrate. Namely, the base layer and clad layer are arranged relative to the piezoelectric substrate in a self-aligning manner, thereby improving production yield. The base layer may be formed by spraying molten metal or depositing vaporized metal, to seal the space between the piezoelectric substrate and the base board while keeping the shape thereof as it is.

A second aspect of the present invention provides a manufacturing method of a surface acoustic wave device, including:

(1) a process of forming an interdigital transducer on a surface of a piezoelectric substrate;

(2) a process of flip-chip-connecting a plurality of the piezoelectric substrates to an aggregate of base boards at predetermined intervals;

(3) a process of emitting particulate first sealing material from above back faces of the piezoelectric substrates to apply the first sealing material to the back faces of the piezoelectric substrates and hang the first sealing material from edges of the piezoelectric substrates to the base boards to form bridging; and (4) a process of depositing second sealing material on the first sealing material.

According to the second aspect of the present invention, the particulate first sealing material is emitted to apply the first sealing material to the back faces of the piezoelectric substrates and hang the first sealing material from edges of the piezoelectric substrates to the base boards to form bridging. The shape of a space formed by the flip-chip connection between the base board and the piezoelectric substrate is kept as it is, to seal the piezoelectric substrate and interdigital transducer. In addition, there is no misalignment of the first and second sealing materials relative to the piezoelectric substrates, to improve production yield. Further, the first sealing material is emitted, and thereon, the dense second sealing material is deposited to secure a sufficient sealing function. As a result, the sealing process is realized with a reduced number of steps at low cost, to provide excellent mass production ability and industrial merit.

BRIEF DESCRIPTION OF DRAWINGS

FIG. 5 is a view explaining positional relationships of sealing material flying onto a base board;

BEST MODE FOR CARRYING OUT THE INVENTION

Figure 1:
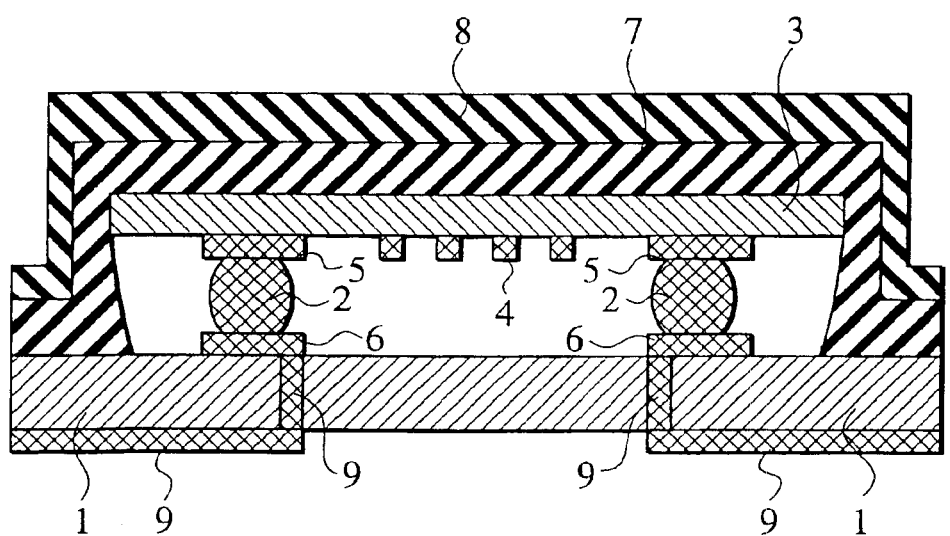
FIG. 1 is a cross-sectional view showing a surface acoustic wave device according to an embodiment 1 of the present invention.

With reference to the drawings, best modes of implementation (hereinafter called "embodiments") of the present invention will be explained. In the drawings, the same or similar parts are represented with the same or similar marks. The drawings are typical and it must be noted that relationships between thicknesses and plane dimensions, thickness ratios among layers, etc., are different from actual ones. Accordingly, specific thicknesses and dimensions must be judged in consideration of the below-mentioned explanations. Naturally, dimensional relationships and ratios differ from one to another among the drawings.

(Embodiment 1)

FIG. 1 is a cross-sectional view showing a surface acoustic wave device according to the embodiment 1 of the present invention. The surface acoustic wave device according to the embodiment 1 has a base board 1 with predetermined wires and electrode pads formed on front and back faces thereof, bumps 2 connected to electrode pads 6 on the base board 1, a surface acoustic wave element with electrode pads 5 and a transducer 4 formed on a surface of a piezoelectric substrate 3, and sealing materials 7 and 8 mechanically connected to the base board 1 and covering and sealing the surface acoustic wave element.

On the back face of the base board 1, there are formed terminals 9 to be connected to the outside, and on the surface thereof, there are formed wiring patterns and the electrode pads 6 connected to the terminals 9. The bumps 2 are connection parts to electrically and mechanically connect the electrode pads 6 to the electrode pads 5. The surface acoustic wave element has the piezoelectric substrate 3, the transducer 4 formed on the surface of the piezoelectric substrate 3, wiring (not shown) connected to the transducer 4, and the electrode pads 5 connected to the wiring. The sealing materials 7 and 8 are applied to the back face of the surface acoustic wave element and hang from edges of the piezoelectric substrate 3 to the base board 1 to form bridging. The surface acoustic wave element is airtightly sealed with the sealing materials 7 and 8 and the base board 1.

The surface of the piezoelectric substrate 3 where the transducer 4 is formed is arranged to face the surface of the base board 1 where the electrode pads 6 are formed. Namely, the surface acoustic wave device according to the embodiment 1 has a flip-chip bonding structure. The bumps 2 sandwiched between the electrode pads 5 and the electrode pads 6 have a height of about several tens of micrometers, and therefore, a space is formed under the transducer 4 so that the piezoelectric substrate 3 is fixed relative to the base board 1 with a given gap interposed between them.

The first sealing material 7 and second sealing material 8 form a two-layer sealing material structure. The first sealing material 7 and second sealing material 8 play different roles. Their common object is to seal the surface acoustic wave element. The first sealing material 7 mainly serves to form bridging from the edges of the piezoelectric substrate 3 to the base board 1.

On the other hand, the second sealing material 8 mainly serves to seal the surface acoustic wave element and separates the space under the transducer 4 from an external space. Accordingly, the second sealing material 8 is preferably a dense film (clad layer) grown over the first sealing material (base layer) 7. For example, it is preferably a plated film or a metal film formed by chemical vapor deposition (CVD). The metal film can be grown with the first sealing material 7 serving as a core. As a result, a dense film can be formed over the first sealing material. In this way, the surface acoustic wave element is surrounded and sealed by the first and second sealing materials 7 and 8 and the base board 1. The first sealing material 7 is a film formed by spraying molten metal or a film formed by depositing vaporized metal.

The first sealing material 7 is a film formed by spraying molten metal or a film formed by depositing vaporized metal, and therefore, an inner side face of the sealing material 7 facing the space under the transducer 4 is inclined. The inclination is oriented from a start point served by the periphery of the back face of the piezoelectric substrate 3 to an end point, which is shifted from an intersection of a normal extended from the start point to the base board surface and the base board surface toward the electrode pad 6 along the base board surface. This is because metal particles flying onto the base board 1 come not only from a normal direction of the base board 1 but also from predetermined angles relative to the normal.

In the surface acoustic wave device, input/output signals processed or generated by the transducer are passed through leads (not shown), the electrode pads 5, the bumps 2, and the electrode pads 6 arranged on the base board 1 to the external connection terminals 9. The space formed under the transducer 4 makes the transducer 4 properly generate surface acoustic waves.

Each view in FIGS. 2 to 4 shows a manufacturing method of the surface acoustic wave device according to the first embodiment.

Figure 2A:
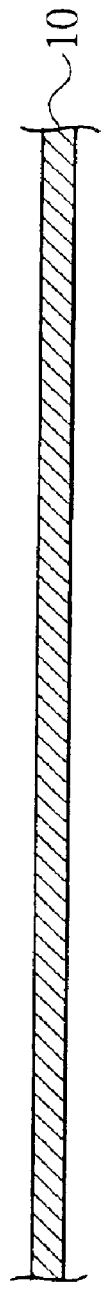
FIGS. 2A to 2D are views (part 1) explaining a manufacturing method of the surface acoustic wave device according to the embodiment 1 of the present invention.

(1) First, as shown in FIG. 2A, a wafer 10 to form the piezoelectric substrate 3 is prepared. The piezoelectric substrate 3 is a monocrystalline substrate made of lithium tantalate ($LiTaO_3$), lithium niobate ($LiNbO_3$), or quartz ($SiO_2$). Alternatively, instead of the monocrystalline substrate, it is possible to employ a piezoelectric ceramics substrate made of lead titanate ($PbTiO_3$), lead titanate zirconate ($PbZrTiO_3$ (PZT)), or a solid solution thereof.

Figure 2B:
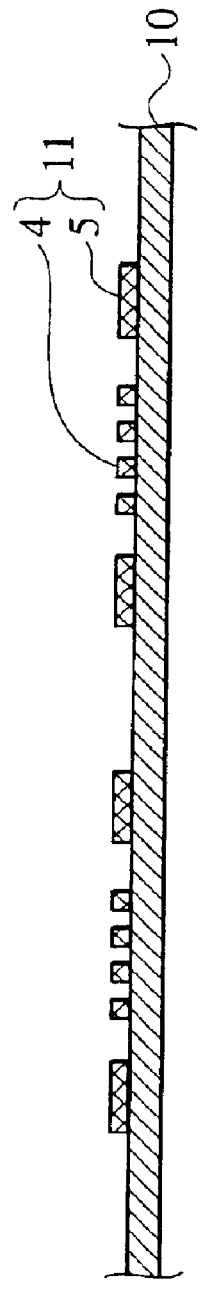

(2) Next, as shown in FIG. 2B, formed on the surface of the piezoelectric wafer 10 is a metal pattern 11 including a transducer 4, electrode pads 5, and leads to connect the transducer 4 to the electrode pads 5. Material of the metal pattern 11 may be aluminum (Al), copper (Cu), or an alloy thereof. More precisely, a sputtering method is employed to form a metal film of about several hundreds of nanometers thick on the piezoelectric wafer 10. On the metal film, a resist film is formed, and a photolithography method is used to expose and develop the resist film. With the resist film as a mask, the metal film is selectively etched by a reactive ion etching (RIE) method, to form the metal pattern 11.

Figure 2C:
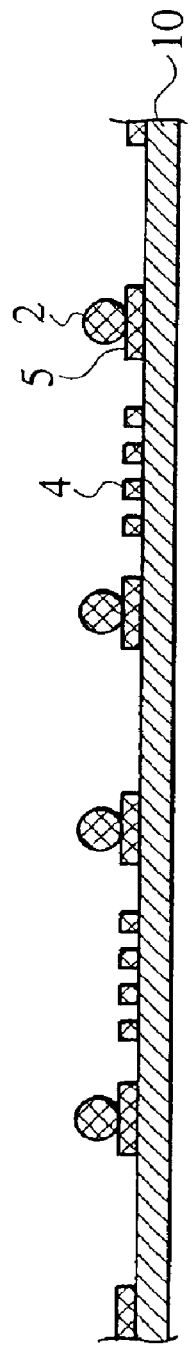

(3) Next, as shown in FIG. 2C, conductive bumps 2 are formed on the electrode pads 5. More precisely, the bumps 2 are vibrated with supersonic waves and are pressed to the electrode pads 5. At this time, the vicinities of the electrode pads 5 may be heated to improve adhesion between the bumps 2 and the electrode pads 5. The bumps are preferably gold (Au) bumps. The gold (Au) bumps 2 properly stick to the electrode pads 5 and show low electric resistance at contacting parts. Instead of the gold bumps 2, solder bumps can be used. A height of the bumps 2 is preferably about 20 to 50 $\mu$m. The height of the bumps 2 determines a gap between the base board 1 and the piezoelectric substrate 3. As will be explained later, the height in the range of 20 to 50 $\mu$m may suppress the diffraction of the first sealing material 7 and easily form bridging.

Figure 2D:
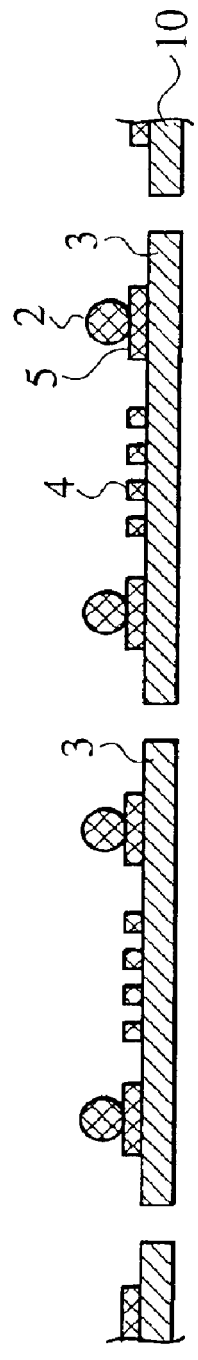

(4) Next, as shown in FIG. 2D, the piezoelectric wafer 10 is diced transducer 4 by transducer 4 into individual surface acoustic wave elements (piezoelectric substrates) 3.

Figure 3A:
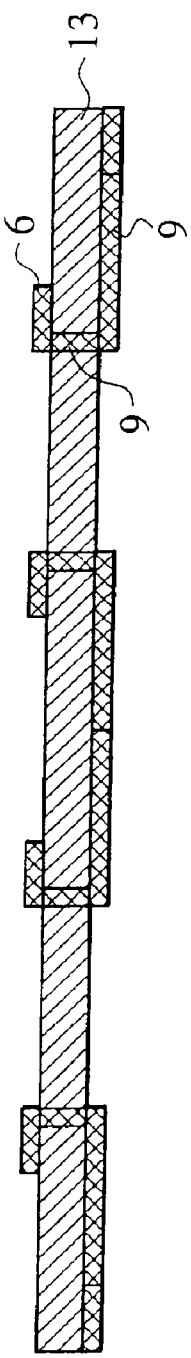
FIGS. 3A to 3C are views (part 2) explaining a manufacturing method of the surface acoustic wave device according to the embodiment 1 of the present invention.

(5) Meanwhile, as shown in FIG. 3A, a multi-piece base-board aggregate 13 is prepared separately from the piezoelectric wafer 10. The aggregate 13 is made of a plurality of concatenated base boards 1. Each base board 1 includes electrode pads 6, external connection terminals 9, and wiring to connect the electrode pads 6 to the external connection terminals 9. The aggregate 13 of the base boards 1 may be a ceramics board made of, for example, alumina ($Al_2O_3$), boron nitride (BN), aluminum nitride (AlN), low-temperature-cofired alumina glass ceramics (LTCC), or the like. On the surfaces of the metal patterns, gold (Au) is plated.

Figure 3B:
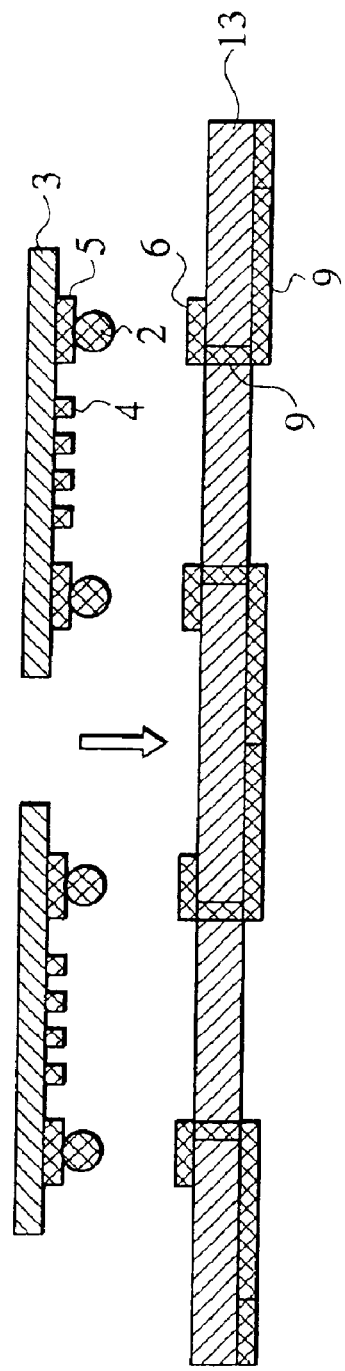
Figure 3C:
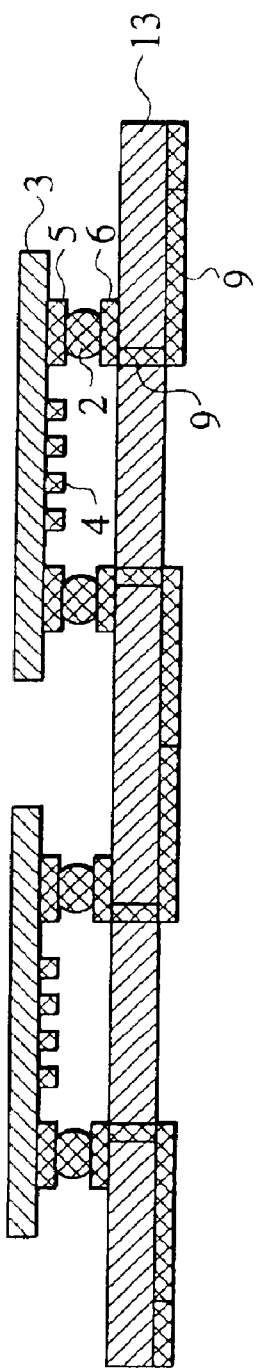

(6) Next, as shown in FIGS. 3B and 3C, the surface acoustic wave elements are flip-chip (face-down)-bonded. Namely, the surfaces of the piezoelectric substrates 3 where the transducers 4, electrode pads 5, etc., are formed are faced to the surface of the aggregate 13 of the base boards 1 where the electrode pads 6 are formed, and the electrode pads 5 and electrode pads 6 are electrically and mechanically connected to each other through the bumps 2.

At this time, a gap between the piezoelectric substrates 3 and the aggregate of the base boards 1 is preferably 100 $\mu$m or shorter. This is to prevent, when spraying molten metal or depositing vaporized metal, the metal from entering into the space between the piezoelectric substrates 3 and the aggregate 13 of the base boards 1 to short-circuit the first sealing material 7 and wiring patterns.

The gap between the piezoelectric substrates 3 and the aggregate 13 of the base boards 1 must be 1 $\mu$m or greater. This is because an amplitude of surface acoustic waves is nearly equal to that (about 1 $\mu$m) and it is necessary to secure a space corresponding to the amplitude of surface acoustic waves under the transducers 4. This gap is the sum of the height of the bumps 2 and the thicknesses of the electrode pads 5 and 6. The height of the bumps 2 is very high compared with the thicknesses of the electrode pads 5 and 6, and therefore, the gap can be changed by changing the height of the bumps 2.

The bumps 2 are pressed to the electrode pads 5 and 6, to electrically and mechanically connect the bumps 2 to the electrode pads 5 and 6. At the time of pressing, the bumps 2 are collapsed and deformed in a height direction. Therefore, to correctly set the gap between the base boards 1 and the piezoelectric substrates 3, the deformation of the bumps 2 due to the collapsing must be considered. At the time of pressing, the bumps 2 may be vibrated with ultrasonic waves relative to the aggregate 13 of the base boards 1, to make the press connection easy. Heating is also effective for the press connection. It is necessary, for proper electrical connection, to leave no coat such as solder resist on the electrode pads 6. For this purpose, resist on the surfaces of the electrode pads may be cleaned by remover. This embodiment employs Au bumps, and therefore, the gap between the piezoelectric substrates 3 and the base board 13 is 20 to 30 $\mu$m after bonding.

Figure 4A:
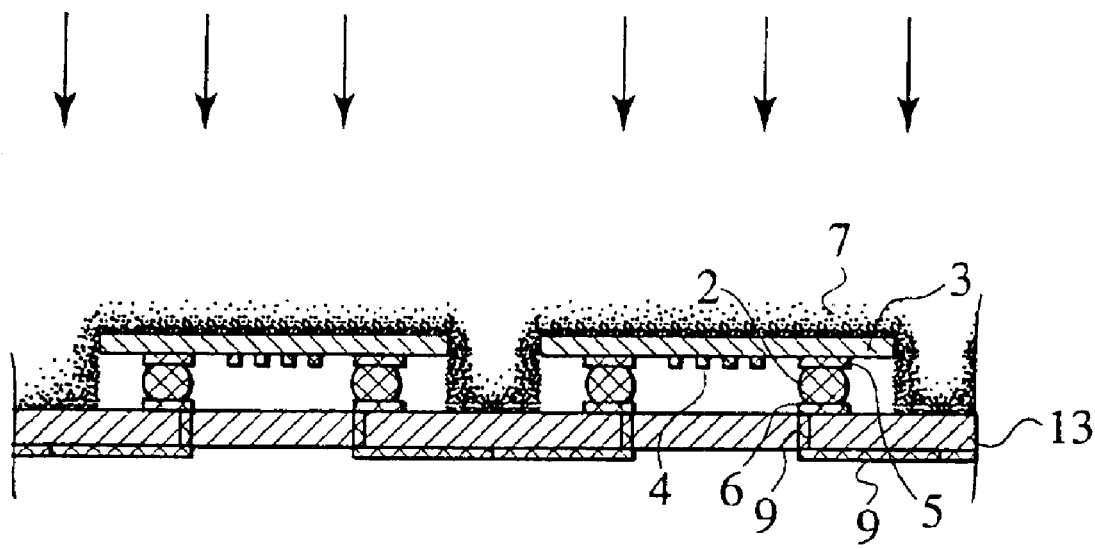
FIGS. 4A and 4B are views (part 3) explaining a manufacturing method of the surface acoustic wave device according to the embodiment 1 of the present invention.

(7) Next, as shown in FIG. 4A, particulate first sealing material 7 is emitted from above the surface acoustic wave element side of the base board 13, to apply the first sealing material 7 onto the aggregate 13 of the base boards 1 and hang the first sealing material 7 from edges of the piezoelectric substrates 3 to the aggregate 13 of the base boards 1 to form bridging. "Emitting particulate first sealing material 7" includes spraying molten metal or depositing vaporized metal. The thickness of the first sealing material 7 is easily adjustable by changing an emitting time of molten metal or a depositing time of vaporized metal.

When emitting molten metal, acetylene ($C_2H_2$) gas is emitted at the same time. The metal used is aluminum. When the particulate metal is emitted, the particle diameter of metal particles (first sealing material) 7 flying onto the piezoelectric substrates 3 and base boards 13 enlarges to about 10 $\mu$m. As a result, the deposited material (first sealing material) 7 becomes coarse, and the metal particles 7 hardly enter into the gap between the piezoelectric substrates 3 and the aggregate 13 of the base boards 1. Due to this, the first sealing material 7 hangs from edges of the piezoelectric substrates 3 to the aggregate 13 of the base boards 1 to form bridging. If the particle diameter is large, bridging will easily be formed, but gaps between particles will easily be generated. If the particle diameter is small, it will be difficult to form bridging but apertures in the bridging will be closed to improve a sealing ability. The particle diameter may be changed by controlling a blown air flow, to simultaneously realize the formation of bridging and the sufficient sealing performance. Increasing an emission speed will reduce the entering of metal particles (into the space).

On the other hand, if depositing vaporized metal, the metal to use may be, for example, inexpensive metal such as copper or aluminum. In this case also, increasing a vapor deposition speed may prevent the entering of metal and a bad influence on the transducer 4 side of the surface acoustic wave elements.

In any case, metal patterns such as wiring must not be formed in areas of the aggregate 13 of the base boards 1 other than areas facing the surface acoustic wave elements. If wiring patterns are formed in the areas not facing the surface acoustic wave elements and if the wiring patterns are signal lines instead of grounding signal lines, they will short-circuit to the first sealing material 7 to which ground potential is applied. It is necessary, therefore, to arrange the wiring patterns 6 such as leads on the base boards 1 under the shades of the substrates 3 in terms of positional relationships between an emission source of molten metal or a source of vaporized metal and the piezoelectric substrates 3.

FIG. 5 is a view explaining positional relationships between emission sources A and B and piezoelectric substrates 31, 32, and 33, and areas on the base board 1 where the first sealing material 7 and patterns 6 are arranged. Here, the emission sources A and B are point sources. Generally, emission sources and the like have expanse, and the characteristics of the expanse can be deemed to be a collection of point sources. It is considered that an overlap of the emission characteristics of the two point sources A and B indicates the characteristics of a standard emission source. The distance between the point sources A and B can represent the size of a standard emission source. The emission source A forms so-called diffraction areas A1 and A3 of the first sealing material 7. The emission source B forms diffraction areas B1, B2, and B3 of the first sealing material 7. A positional relationship between the emission source A and the piezoelectric substrate 32 causes no diffraction. The emission source B causes diffraction even on the substrate 32, to produce diffraction on all piezoelectric substrates 31, 32, and 33. Generally, the size (the distance between the point sources A and B) of an emission source and the like is considered to be greater than the size of a piezoelectric substrate, and therefore, it seems that all piezoelectric substrates suffer from diffraction. On the other hand, the patterns 6 must be arranged in areas excluding the diffraction areas A1, A3, B1, B2, and B3. The reason why the molten-metal emitting method or the vaporized-metal depositing method is employed is because they involve less diffraction compared with other film forming methods such as a chemical vapor deposition (CVD) method and a sputtering method.

Figure 4B:
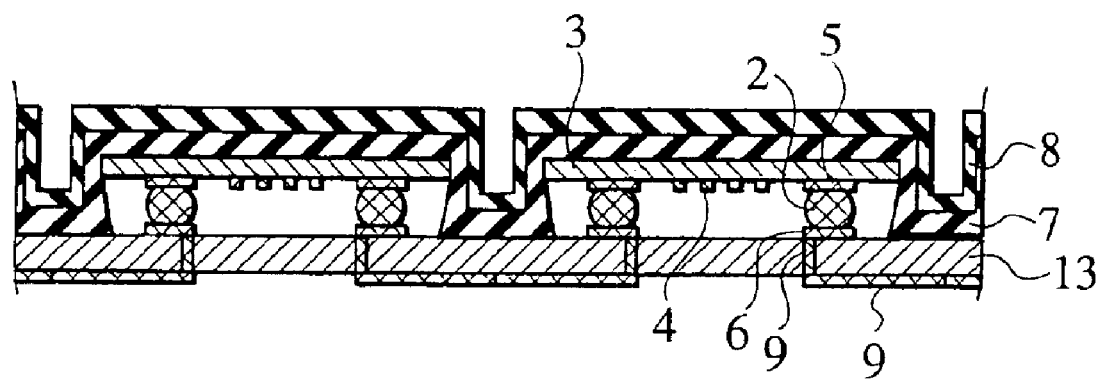

(8) Next, as shown in FIG. 4B, an outer surface of the deposited base layer (first sealing material) 7 is plated with nickel (Ni) to form a surface layer (second sealing material) 8. The plating may be electroplating or electroless plating. Instead of plating, it may be dipped in conductive paste and heat-treated. With this, a conductive (metal) film is formed. If the base layer 7 is a metal film, an inexpensive plating method is employable to form a dense metal film serving as the surface layer (clad layer) and improve sealing performance. In the sealing material formed with this method, the surface layer has a lower porosity (pores) and denser than the base layer, to provide proper sealing. The porosity can be determined by observing a cross section with an optical or electronic microscope.

Figure 6:
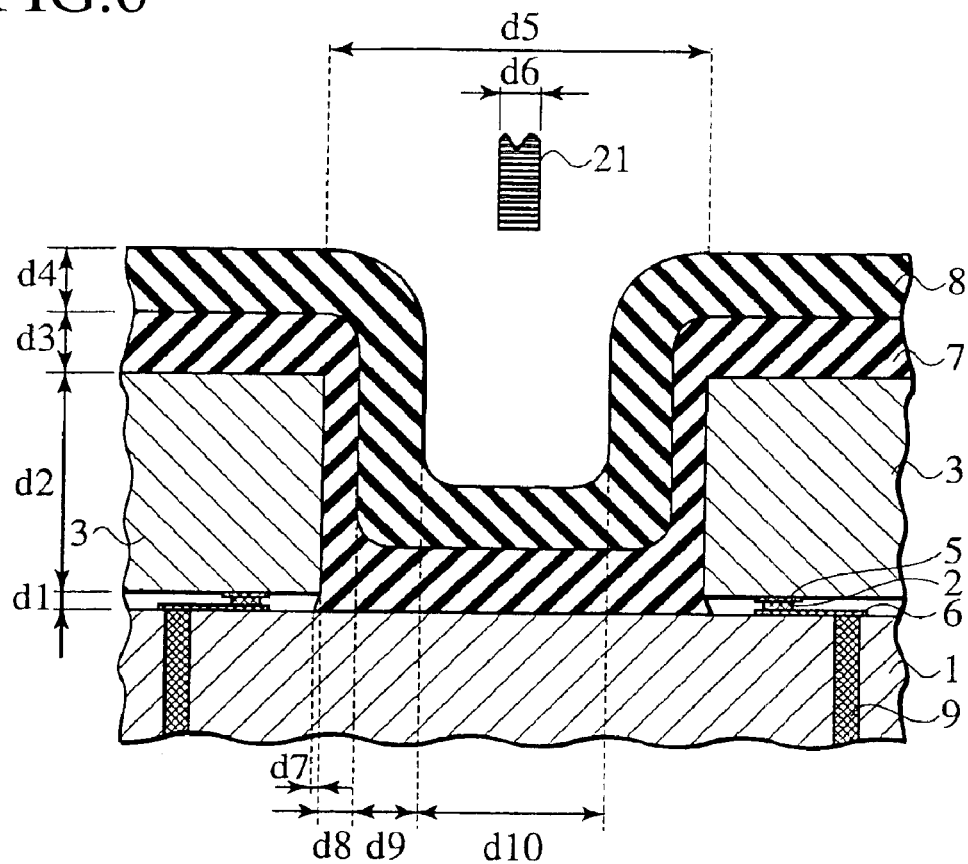
FIG. 6 is a cross-sectional view showing an interval portion of surface acoustic wave elements with a fixed aspect ratio.

FIG. 6 is a structural view showing the peripheries of end areas of the piezoelectric substrates 3 of FIG. 4B with an aspect enlargement ratio and an enlargement ratio of all components being fixed. A distance d1 between the base board 1 and the piezoelectric substrate 3 is about 25 $\mu$m, and a thickness d2 of the piezoelectric substrate 3 is about 350 $\mu$m. A thickness of the first sealing material 7 is preferably 10 to 100 $\mu$m, and this time, it is 100 $\mu$m. In terms of manufacturing efficiency, it is preferable to be 10 to 50 $\mu$m in the case of vapor deposition and 50 to 100 $\mu$m in the case of molten metal spraying. However, the thickness of the first sealing material 7 has anisotropy and a thickness d8 is about half the thickness d3. The second sealing material 8 made of a plated film involves thicknesses d4 and d9 that are substantially equal to each other and is about 100 $\mu$m. If a distance d5 between the piezoelectric substrates 3 is about 600 $\mu$m, a width d10 of a space sandwiched between the second sealing material layers 8 is about 300 $\mu$m. A width d6 of a blade 21 of a dicing apparatus for the base board aggregate 13 is 60 $\mu$m, and if a dicing width margin is about the same, a cut-off width is about 120 $\mu$m which is smaller than the width d10. Accordingly, the sealing material 8 formed along side walls of the piezoelectric substrates 3 will not be damaged.

When the aggregate 13 of the base boards 1 is diced, the first sealing material 7 is exposed along a cut face. There was no deterioration of sealing effect due to the exposure. This may be because a distance of 200 $\mu$m or over is secured from the exposed face of the first sealing material 7 to the sealed space. To improve the safety of sealing, the exposed area of the first sealing material 7 may be reduced, and thinning the film thickness of the first sealing material 7 may reduce the exposed area.

A diffraction amount d7 is about 20 $\mu$m which is smaller than the distance d1. A distance from a side face of the piezoelectric substrate 3 to the electrode pad 6 is set to be about 80 $\mu$m, and therefore, the first sealing material 7 will not be brought into contact with the electrode pad 6. Further, when the first sealing material 7 forms an inner side wall for the sealed space, the side wall is completed before the film thickness of the first sealing material 7 exceeds the distance d1, and therefore, it seems preferable that the film thickness of the first sealing material 7 is greater than the distance d1.

(9) Lastly, the aggregate 13 of the base boards 1 is divided into individual pieces by a dicing apparatus, an individual-piece dividing apparatus, or the like. This enables the aggregate 13 of the base boards 1 to be divided into many chips, to realize mass production. Through the processes mentioned above, the surface acoustic wave device shown in FIG. 1 is completed.

The surface acoustic wave device produced in this way seals the space formed by the flip-chip connection between the base board 1 and the piezoelectric substrate 3 as it is, to provide a small structure appropriate for surface mounting. There is no misalignment of the first sealing material 7 and second sealing material 8 relative to the piezoelectric substrate 3. The first sealing material 7 and second sealing material 8 are arranged relative to the piezoelectric substrate 3 in a so-called self-aligning manner, to improve production yield.

The first sealing material 7 is formed by spraying molten metal or by depositing vaporized metal, and on the surface thereof, metal plating (second sealing material) 8 is made, to easily improve sealing performance. This is achievable with a small number of processes at low cost, to facilitate mass production and improve industrial merit.

Although the embodiment 1 has been explained in connection with the surface acoustic wave device, the present invention is not limited thereto and is generally applicable to electronic devices. In particular, it is appropriate for devices having movable parts such as surface acoustic waves. For example, it is applicable to an acceleration sensor having a plumb body. This is because the present invention is capable of easily forming a sealed space and accommodating a movable part in the space to provide stabilized device characteristics.

(Embodiment 2)

Figure 7:
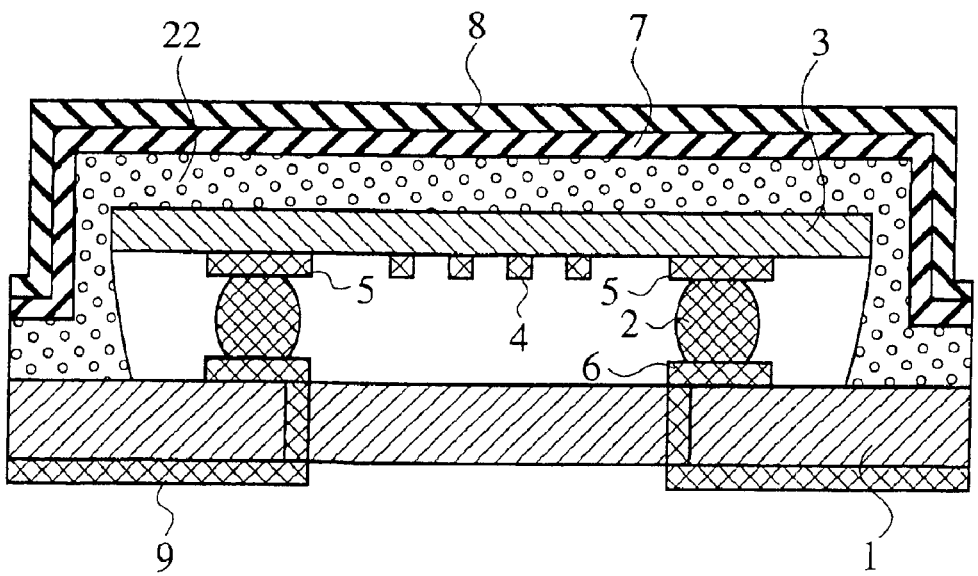
FIG. 7 is a cross-sectional view showing a surface acoustic wave device according to an embodiment 2 of the present invention.

FIG. 7 is a cross-sectional view showing a surface acoustic wave device according to the embodiment 2 of the present invention. The surface acoustic wave device of the embodiment 2 also has a base board 1, bumps 2, and a surface acoustic wave element, which have the same arrangements as the base board 1, bumps 2, and surface acoustic element of the device of the embodiment 1. A sealing material is mechanically connected to the base board 1, and together with the base board 1, covers and seals the surface acoustic wave element. The structure of the sealing material differs from that of the embodiment 1 and has a three-layer structure.

According to the embodiment 2, the sealing material consists of insulating resin 22, first sealing material 7, and second sealing material 8. The insulating resin 22 is, for example, polyvinyl alcohol resin. Employing the insulating resin 22 prevents short circuits between metal wiring such as wiring pads 6 and the first sealing material 7. The insulating resin 22 is naturally intended to provide sealing but its primary object is to form bridging between the base board 1 and a piezoelectric substrate 3. The insulating resin 22 is formed by spraying (jetting) and depositing resin solved in a solvent and by volatizing the solvent. Accordingly, an inner side face of the insulating resin 22 facing a space under a transducer 4 is inclined. The inclination is oriented from a start point served by the periphery of a back face of the piezoelectric substrate 3 to an end point, which is shifted from an intersection of a normal extended from the start point to the base board surface and the base board surface toward the electrode pad 6 along the base board surface. This is because the sprayed solvent, etc., fly to the board 1 not only from a normal direction of the base board 1 but also from directions other than the normal direction.

Like the embodiment 1, the first sealing material 7 is a base layer formed by spraying molten metal or by depositing vaporized metal. However, the object of arranging the same differs from that of the first sealing material 7 of FIG. 1 of the embodiment 1. A bridging object of the embodiment 1 is diluted, and a main object is to improve sealing property and provide a base layer for forming the second sealing material

8 by plating. The second sealing material 8 is metal made by plating. A main object of the second sealing material 8 is sealing.

FIGS. 2, 3, and 8 are views showing a manufacturing method of the surface acoustic wave device according to the embodiment 2 of the present invention. Compared with the manufacturing method of the embodiment 1, the manufacturing method of the surface acoustic wave device of the embodiment 2 involves the same operations as those of FIGS. 2 and 3 whose explanation will be omitted and different operations in the last process which will be explained.

Figure 8A:
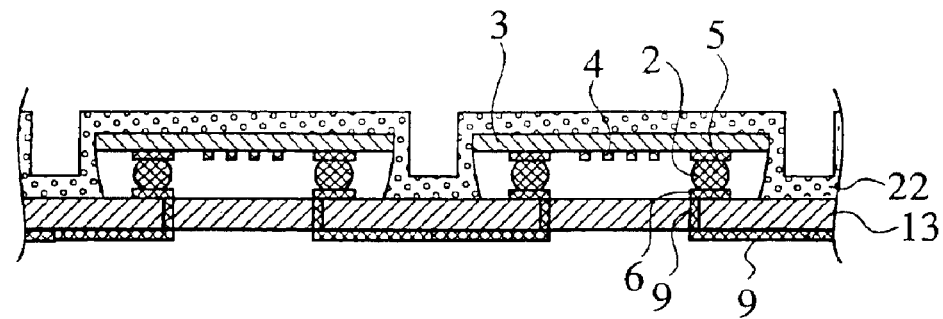
FIGS. 8A to 8C are views explaining a manufacturing method of the surface acoustic wave device according to the embodiment 2 of the present invention.

(1) First, as shown in FIG. 3C followed by FIG. 8A, an insulating resin film 22 is formed by deposition from above the surface acoustic wave elements of the base board 1. More precisely, insulating resin powder is first solved in n-butanol serving as a solvent. This liquid is sprayed from the surface acoustic wave element side, to deposit the insulating resin film 22.

The thickness of the insulating resin film 22 is easily adjustable by changing a spray time. At this moment, it is preferable to face a surface of the surface acoustic wave element on the transducer 4 side toward the ground surface and spray the liquid from the back face side of the surface acoustic wave element. Properly adjusting the ratio of the solvent to the resin may control viscosity. In addition, selecting a solvent may provide a quick-drying property. In this way, the insulating resin film 22 may be deposited without entrance to the transducer 4 of the surface acoustic wave element or badly affecting the same.

Figure 8B:
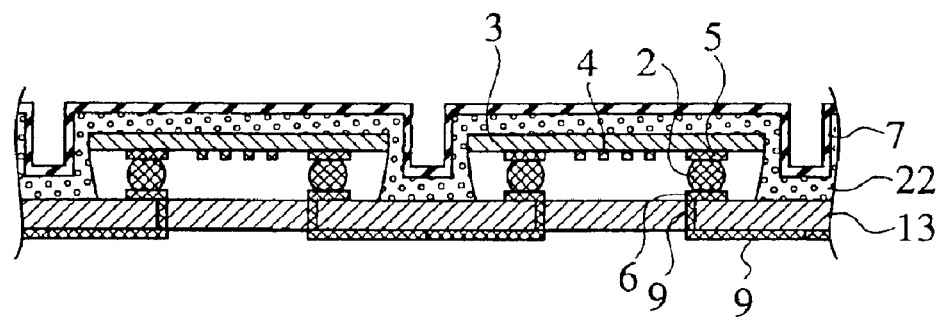

(2) Next, as shown in FIG. 8B, molten metal is sprayed or vaporized metal is deposited from above the surface acoustic wave element side of the base board 13, to deposit first sealing material 7. A forming method of the first sealing material 7 is the same as that of the embodiment 1. Since the insulating resin film 22 is present, there is no restriction of the embodiment 1 that no metal patterns 6 such as wiring must be formed in areas other than the areas of the base board 1 facing the surface acoustic wave element, and therefore, wiring can freely be made.

Figure 8C:
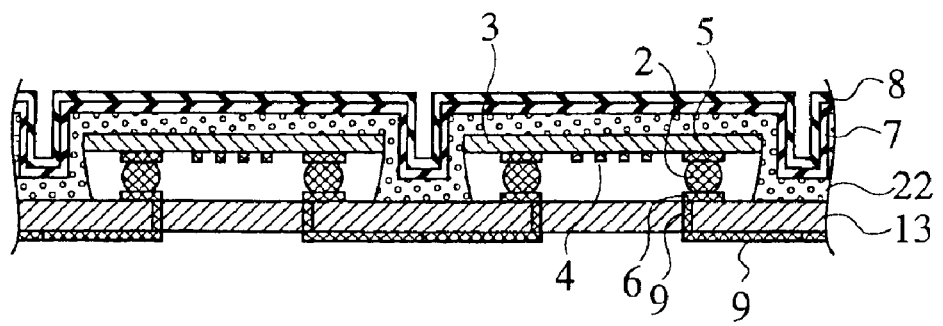

(3) Lastly, as shown in FIG. 8C, an outer face of the deposited metal part 7 is plated with nickel (Ni) to form a plated film 8. Processes that follow the plating are achieved like the processes that follow the plating of the embodiment 1.

The surface acoustic wave device manufactured in this way seals a space formed by flip-chip connection between the substrates 1 and 3 as it is, and therefore, provides a compact structure suitable for surface mounting. There is no misalignment of the sealing materials 22, 7, and 8 relative to the piezoelectric substrate 3. The sealing materials 22, 7, and 8 are arranged relative to the piezoelectric substrate 3 in a so-called self-aligning manner, to improve production yield.

The first sealing material is formed by spraying and depositing an insulating resin layer and by spraying molten metal or by depositing vaporized metal, and the second sealing material is formed by metal plating, to easily improve sealing performance. This is achievable with a small number of processes at low cost, to facilitate mass production and improve industrial merit.

As explained above, the embodiment 1 and embodiment 2 of the present invention easily provide a miniaturized surface-mounting surface acoustic wave device capable of easily achieving sealing function and suitable for flip-chip connection, as well as a manufacturing method thereof.

In these embodiments, it is preferable to make the thickness of the base layer equal to or greater than a gap between the piezoelectric substrate and the base board, so that a metal layer or an insulating layer serving as the base layer may form proper bridging. For example, when Au bumps are employed, it is preferable that the base layer is 20 $\mu$m thick or thicker. In terms of manufacturing efficiency and device miniaturization, it is preferable to be 1000 $\mu$m, more preferably, 500 $\mu$m or thinner. At this time, a deposition thickness of the base layer can be represented with a deposited thickness on the piezoelectric substrate.

In the above-mentioned embodiments, the metal layer serving as the surface layer (base layer) may be clad with a still another layer (for example, an epoxy resin layer formed by screen printing or stamping). For example, these layers may be used for a marking of device identification.

What is claimed is:

1. A surface acoustic wave device comprising: a surface acoustic wave element with an interdigital transducer formed on a surface of a piezoelectric substrate;

a base board to which the surface acoustic wave element is flip-chip-connected;

a base layer applied to a back face of the piezoelectric substrate and hanging from edges of the piezoelectric substrate to the base board to form bridging; and a clad layer applied to the base layer, wherein an edge of the base layer is exposed after dicing.

2. The surface acoustic wave device of claim 1, wherein the clad layer is a layer denser than the base layer.

3. The surface acoustic wave device of claim 1, wherein the clad layer is a metal layer.

4. The surface acoustic wave device of claim 1, wherein the base layer is a metal layer.

5. The surface acoustic wave device of claim 1, wherein the base layer is an insulating layer.

6. The surface acoustic wave device of claim 1, wherein a distance between the surface acoustic wave element and the base board is 100 $\mu$m or smaller.

* * * * *